US008138857B2

(12) United States Patent
Ding et al.

(10) Patent No.: US 8,138,857 B2
(45) Date of Patent: Mar. 20, 2012

(54) STRUCTURE, STRUCTURE AND METHOD FOR PROVIDING AN ON-CHIP VARIABLE DELAY TRANSMISSION LINE WITH FIXED CHARACTERISTIC IMPEDANCE

(75) Inventors: Hanyi Ding, Essex Junction, VT (US); Wayne H. Woods, Jr., Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 732 days.

(21) Appl. No.: 12/144,682

(22) Filed: Jun. 24, 2008

(65) Prior Publication Data

US 2009/0315633 A1    Dec. 24, 2009

(51) Int. Cl.
*H01P 1/18*    (2006.01)

(52) U.S. Cl. .................. 333/161; 333/164; 333/33

(58) Field of Classification Search .......... 333/138–140, 333/156, 161, 164–185, 202–206, 33
See application file for complete search history.

(56) References Cited

U.S. PATENT DOCUMENTS

| | | | |
|---|---|---|---|
| 4,604,591 A | 8/1986 | Vasile | |
| 4,706,177 A | 11/1987 | Josephson | |
| 5,682,124 A * | 10/1997 | Suski | 333/1 |
| 5,723,908 A | 3/1998 | Fuchida et al. | |
| 6,545,931 B2 | 4/2003 | Hidaka | |
| 6,674,174 B2 | 1/2004 | Chungpaiboonpatana et al. | |
| 6,816,031 B1 | 11/2004 | Miller | |
| 6,959,062 B1 | 10/2005 | Stubbs | |
| 7,332,983 B2 | 2/2008 | Larson | |
| 7,352,325 B1 | 4/2008 | Floyd et al. | |
| 7,368,311 B2 | 5/2008 | Tilmans et al. | |
| 2002/0069374 A1 | 6/2002 | Kopser et al. | |
| 2004/0153684 A1 | 8/2004 | Liu et al. | |
| 2005/0062137 A1 | 3/2005 | Singh et al. | |
| 2005/0262459 A1 | 11/2005 | Schumann | |
| 2006/0164141 A1 | 7/2006 | Self | |
| 2007/0226659 A1 | 9/2007 | Suaya et al. | |

OTHER PUBLICATIONS

P.A. Brennan, et al.; "Delay Line for Use with Integrated Circuits"; Apr. 1967; IBM TDB 04-67, Abstract.
E.P. Harris; "Superconducting Delay Line With Electronically Variable Delay"; Oct. 1972; IBM TDB 10-72, Abstract.
S.B. Kaplan; "Variable on Chip Delay Line with Josephson Devices"; Mar. 1983; IBM TDB 03-83, Abstract.
International Search Report and written opinion dated Oct. 8, 2009 for International Application No. PCT/US2009/047598.
Office Action dated Jun. 30, 2011 in U.S. Appl. No. 12/144,684.
Office Action dated Feb. 10, 2011 in U.S. Appl. No. 12/144,684.

* cited by examiner

*Primary Examiner* — Benny Lee
*Assistant Examiner* — Gerald Stevens
(74) *Attorney, Agent, or Firm* — Anthony Canale; Roberts Mlotkowski Safran & Cole, P.C.

(57) ABSTRACT

A design structure, structure, and method for providing an on-chip variable delay transmission line with a fixed characteristic impedance. A method of manufacturing a transmission line structure includes forming a signal line of the transmission line structure, forming a first ground return structure that causes a first delay and a first characteristic impedance in the transmission line structure, and forming a second ground return structure that causes a second delay and a second characteristic impedance in the transmission line structure. The first delay is different from the second delay, and the first characteristic impedance is substantially the same as the second characteristic impedance.

24 Claims, 11 Drawing Sheets

STRUCTURE, STRUCTURE AND METHOD FOR PROVIDING AN ON-CHIP VARIABLE DELAY TRANSMISSION LINE WITH FIXED CHARACTERISTIC IMPEDANCE

CROSS-REFERENCE TO RELATED APPLICATIONS

This application is related to U.S. Ser. No. 12/144,684 filed on the same day.

FIELD OF THE INVENTION

The invention relates to a transmission line, and more particularly, to a design structure, structure, and method for providing an on-chip variable delay transmission line with a fixed characteristic impedance.

BACKGROUND

Conventional on-chip transmission line structures generally have fixed impedance and fixed delay. Usually, delay and impedance cannot be arbitrarily chosen for a given transmission line. Instead, the delay and impedance are affected by the capacitance and inductance, which vary inversely to one another based upon the distance between the signal line and the ground return line(s). As such, while it is possible to change the delay of a transmission line, changing the delay comes at the cost of increasing signal loss, changing the characteristic impedance, and/or increasing the required area (e.g., footprint) of the transmission line device.

Changing the delay of a transmission line, however, is desirable for a number of applications. For example, delay lines are utilized in signal processing operations for adjusting the time of arrival of one signal relative to that of a second signal. The delay lines may be fabricated for digital circuitry or analog circuitry, and the delay may be fixed or variable. With respect to delaying a signal having a sinusoidal waveform, this being a frequent situation in microwave applications, the effect of the delay line is to impart a phase shift; thus, in this situation the delay line may be regarded as a phase shifter.

A plurality of phase-adjustable lines may be used in a phased array. Generally speaking, a phased array is a group of antennas in which the relative phases of the respective signals feeding the antennas are varied in such a way that the effective radiation pattern of the array is reinforced in a desired direction and suppressed in undesired directions. The relative amplitudes of, and constructive and destructive interference effects among, the signals radiated by the individual antennas determine the effective radiation pattern of the array. Phased arrays are used to electronically steer the direction of maximum sensitivity of a receiver, providing spatial selectivity or equivalently higher antenna gain. Phased arrays find use in many different wireless applications, including but not limited to RADAR and data communications. Beam steering is achieved by first shifting the phase of each received signal by progressive amounts to compensate for the successive differences amongst arrival phases. These signals are then combined, where the signals add constructively for the desired direction and destructively for other directions.

A conventional way of controlling the phase of each element in a phased array is to provide each element with a plurality of transmission lines, each of the transmission lines having a known delay. A switch in the signal path of each element is used to select a particular transmission line for that element, thereby imparting a known delay to the element.

However, such systems suffer from numerous drawbacks. For example, providing each element with a plurality of transmission lines is costly in terms of space used (e.g., footprint), manufacturing, etc. Also, the switch in the signal path of each element causes signal attenuation, which is undesirable in such applications.

Moreover, as described above, conventional systems are incapable of changing the delay of a transmission line without either increasing signal loss, changing the characteristic impedance, and/or increasing the required area (e.g., footprint) of the transmission line device. Thus, systems that utilize delays (e.g., phased-array antenna systems) suffer from these drawbacks.

Accordingly, there exists a need in the art to overcome the deficiencies and limitations described hereinabove.

SUMMARY

In a first aspect of the invention, there is a method of manufacturing a transmission line structure. The method comprises forming a signal line of the transmission line structure, forming a first ground return structure that causes a first delay and a first characteristic impedance in the transmission line structure, and forming a second ground return structure that causes a second delay and a second characteristic impedance in the transmission line structure. The first delay is different from the second delay, and the first characteristic impedance is substantially the same as the second characteristic impedance.

In embodiments, the signal line, first ground return structure and second ground return structure are formed in a semiconductor structure. The signal line may be formed in a first wiring level of the semiconductor structure, the first ground return structure is formed in a second wiring level of the semiconductor structure, and the second ground return structure formed in a third level of the semiconductor structure. The first wiring level may be different from the second wiring level, and a portion of the first ground return structure may also formed in the first wiring level. In further embodiments, the signal line is formed in a first wiring level of the semiconductor structure, the first ground return structure is formed in the first wiring level, and portions of the second ground return structure are formed in the first wiring level and a second wiring level of the semiconductor structure.

According to aspects of the invention, a switch operates to ground one of the first and second ground return structures and to float the other of the second and first ground return structures, respectively. Additionally or alternatively, the first ground return structure may comprise a first ground return rail and a first capacitance structure, and the second ground return structure comprise a second ground return rail and a second capacitance structure. Also, the first ground return rail may be further away from the signal line than the second ground return rail, and the first capacitance structure may be closer to the signal line than the second capacitance structure.

In embodiments, the first and second delays are delays of a signal in the signal line. The first delay may be about 16% different from the second delay, and the first characteristic impedance less than about 5% different from the second characteristic impedance. Moreover, the first characteristic impedance may be about 50 ohm.

In a second aspect of the invention, there is a method of manufacturing a semiconductor structure, comprising: forming a signal line; forming a first ground return rail and a first capacitance structure; and forming a second ground return rail and a second capacitance structure. The first ground return rail is further away from the signal line than the second ground return rail, and the first capacitance structure is closer to the signal line than the second capacitance structure. Grounding of the signal line is selectively switched between the first ground return rail and the second ground return rail.

In a third aspect of the invention, there is a method of transmitting a signal in a transmission line structure, comprising: grounding a first ground return structure that causes a first delay and a first characteristic impedance of the transmission line structure; floating a second ground return structure that causes a second delay different from the first delay and a second characteristic impedance substantially the same as the first characteristic impedance; and transmitting a signal on a signal line of the transmission line structure.

In a fourth aspect of the invention, there is a method comprising switching a transmission line structure between: (i) a first ground return structure that creates a first delay and a first characteristic impedance in the transmission line structure and (ii) a second ground return structure that creates a second delay and a second characteristic impedance of the transmission line structure. The first delay is substantially different from the second delay, and the first characteristic impedance is substantially equal to the second characteristic impedance.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a transmission line, and more particularly, to a design structure, structure, and method for providing an on-chip variable delay transmission line with a fixed characteristic impedance. In embodiments, a transmission line structure is provided with plural, selectable ground return paths. More specifically, the respective ground return paths are formed with different geometries and at different distances away from the signal line, such that each ground return path causes the transmission line structure to have a different delay. Moreover, the ground paths are designed such that regardless of which ground path is used, the characteristic impedance of the transmission line structure remains substantially unchanged. In this manner, by controlling which ground return structure is grounded and which is floating, the delay of the transmission line structure can be changed without substantially changing the characteristic impedance of the transmission line structure. Accordingly, implementations of the invention provide a single microstrip structure in which the delay can be varied while the characteristic impedance is kept relatively constant.

Structures in Accordance with the Invention

Figure 1:
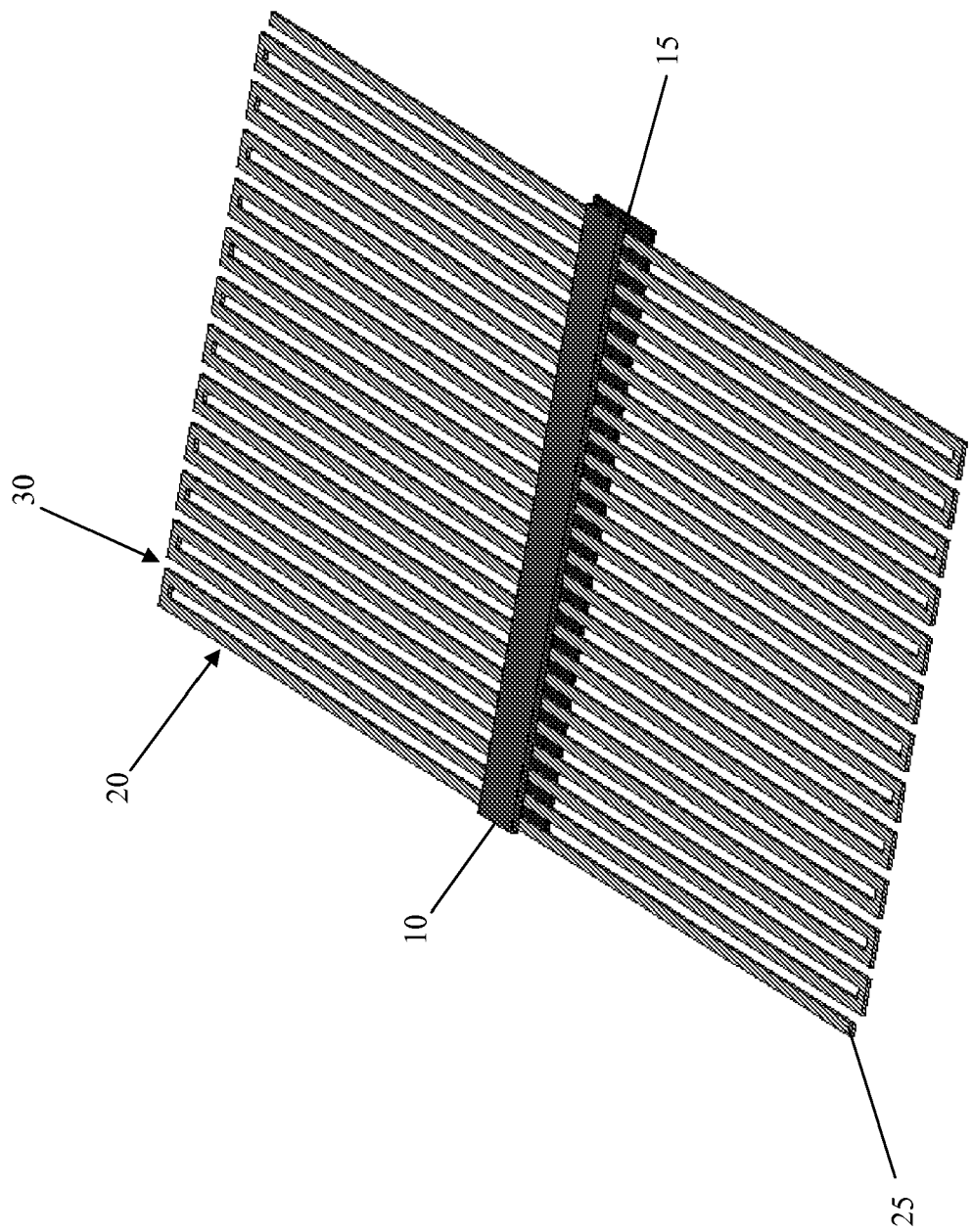
FIGS. 1-5 show structures in accordance with aspects of the invention.

FIG. 1 shows a diagrammatic view of a structure in accordance with aspects of the invention. The structure comprises a signal line 10 and a ground return line 15, which may be formed in wiring levels of a semiconductor device, as described in greater detail below. The semiconductor device may comprise, for example, a transmission line structure.

As is known such that further explanation is not believed necessary, the characteristic impedance of a transmission line structure may be approximated as the square root of the ratio of the inductance ("L") to the capacitance ("C"), e.g., SQRT (L/C). Moreover, the delay of a transmission line structure may be approximated as the square root of the product of the inductance and the capacitance, e.g., SQRT(L*C). Additionally, the capacitance of a transmission line structure generally decreases with the distance between the signal line and the ground return line, while the inductance of the transmission line structure generally increases with the distance between the signal line and the ground return line.

As such, if the ground return line 15 is moved closer to the signal line 10, the capacitance of the transmission line structure will increase and the inductance of the transmission line structure will decrease. Alternatively, as the ground return line 15 is moved further away from the signal line 10, the capacitance of the transmission line structure decreases while the inductance of the transmission line structure increases. Owing to this opposite relationship of capacitance and inductance with respect to the distance between the signal line and ground return line, it is not possible to use conventional structures to vary the transmission line structure delay without also varying the characteristic impedance of the transmission line structure.

However, in accordance with aspects of the invention, the structure shown in FIG. 1 includes a capacitance shield 20, which provides for selectively changing the capacitance of the transmission line structure without significantly altering the inductance of the transmission line structure. As seen in FIG. 1, the capacitance shield 20 is formed between the signal line 10 and the ground return line 15, for example, in a wiring level between the respective wiring levels of the signal line 10 and the ground return line 15. In the embodiment shown in FIG. 1, the capacitance shield 20 is made of a trace 25 formed in a serpentine manner with spaces 30 between portions of the trace 25 that are perpendicular to the signal line 10. In this manner, the capacitance shield 20 may be used to affect the capacitance of the transmission line structure, while being substantially inductively invisible.

Still referring to FIG. 1, when the capacitance shield 20 is grounded to the ground return line 15, the capacitance of the transmission line structure will be a first value, and when the capacitance shield 20 is floating (e.g., is not grounded to the ground return line 15), the capacitance of the transmission line structure will be a second value different from the first value. In this manner, by using a switch in the ground return path (e.g., in the active region of the semiconductor), the capacitance shield 20 can be selectively switched between grounded and floating to selectively change the value of the capacitance for the transmission line structure while keeping the inductance of the transmission line structure relatively constant.

The difference in capacitance between the grounded and floating states of the capacitance shield 20 will depend on parameters such as, for example, vertical distance between the signal line 10 and the plane of the capacitance shield 20, width of the trace 25, and width of the space 30. In embodiments, any suitable values may be used for these parameters. For example, Table 1 shows a comparison of capacitance and inductance values for grounded and floating states of two exemplary arrangements. In the first arrangement, the width of the trace 25 is about 1 µm, and the width of the space 30 is about 1 µm. In the second arrangement, the width of the trace 25 is about 2 µm, and the width of the space 30 is about 2 µm.

TABLE 1

| Arrangement | State of Capacitance Shield | Capacitance (femtofarad) | Inductance (picohenry) |
|---|---|---|---|
| First | Floating | 15.009 | 11.627 |
| First | Grounded | 20.186 | 11.615 |
| Second | Floating | 14.797 | 11.678 |
| Second | Grounded | 19.293 | 11.656 |

Figure 2:
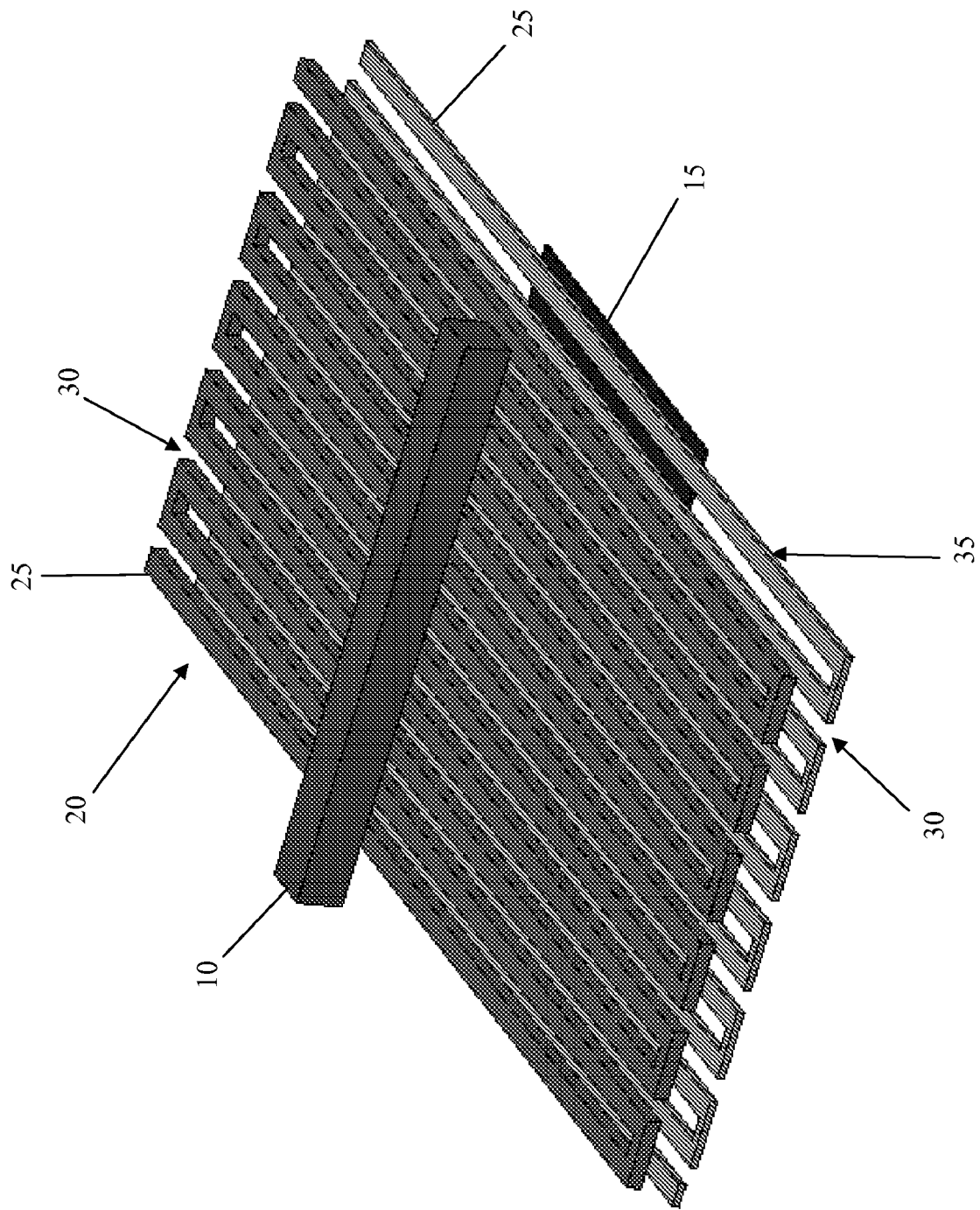

FIG. 2 shows another structure in accordance with aspects of the invention. Similar to FIG. 1, the structure comprises a signal line 10, a ground return line 15, and capacitance shield 20, which may be formed of metal in wiring levels of a semiconductor device such as a transmission line. The structure of FIG. 2 includes a second capacitance shield 35 arranged between the first capacitance shield 20 and the ground return line 15. At least one switch (not shown) is operatively connected to the ground return line 15, the first capacitance shield 20, and the second capacitance shield 35, such that one of the shields may be grounded to the ground return line while the other shield is floated.

Table 2 shows values of capacitance and inductance for a transmission line structure in accordance with FIG. 2. The values of table 2 are for a transmission line structure in which the width of the trace 25 of each capacitance shield 20, 35 is about 2 µm, and the width of the space 30 between portions of the trace is about 2 µm. As is apparent from Table 2, the capacitance of the transmission line structure can be manipulated by selectively grounding one or both of the capacitance shields 20, 35, while the inductance is kept relatively constant.

TABLE 2

| Capacitance Shield States | Capacitance (femtofarad) | Inductance (picohenry) |
|---|---|---|
| First Shield (20) Floating Second Shield (35) Floating | 6.553 | 24.567 |
| First Shield (20) Floating Second Shield (35) Grounded | 7.211 | 24.529 |
| First Shield (20) Grounded Second Shield (35) Floating | 8.013 | 24.507 |
| First Shield (20) Grounded Second Shield (35) Grounded | 8.018 | 24.470 |

Figure 3:
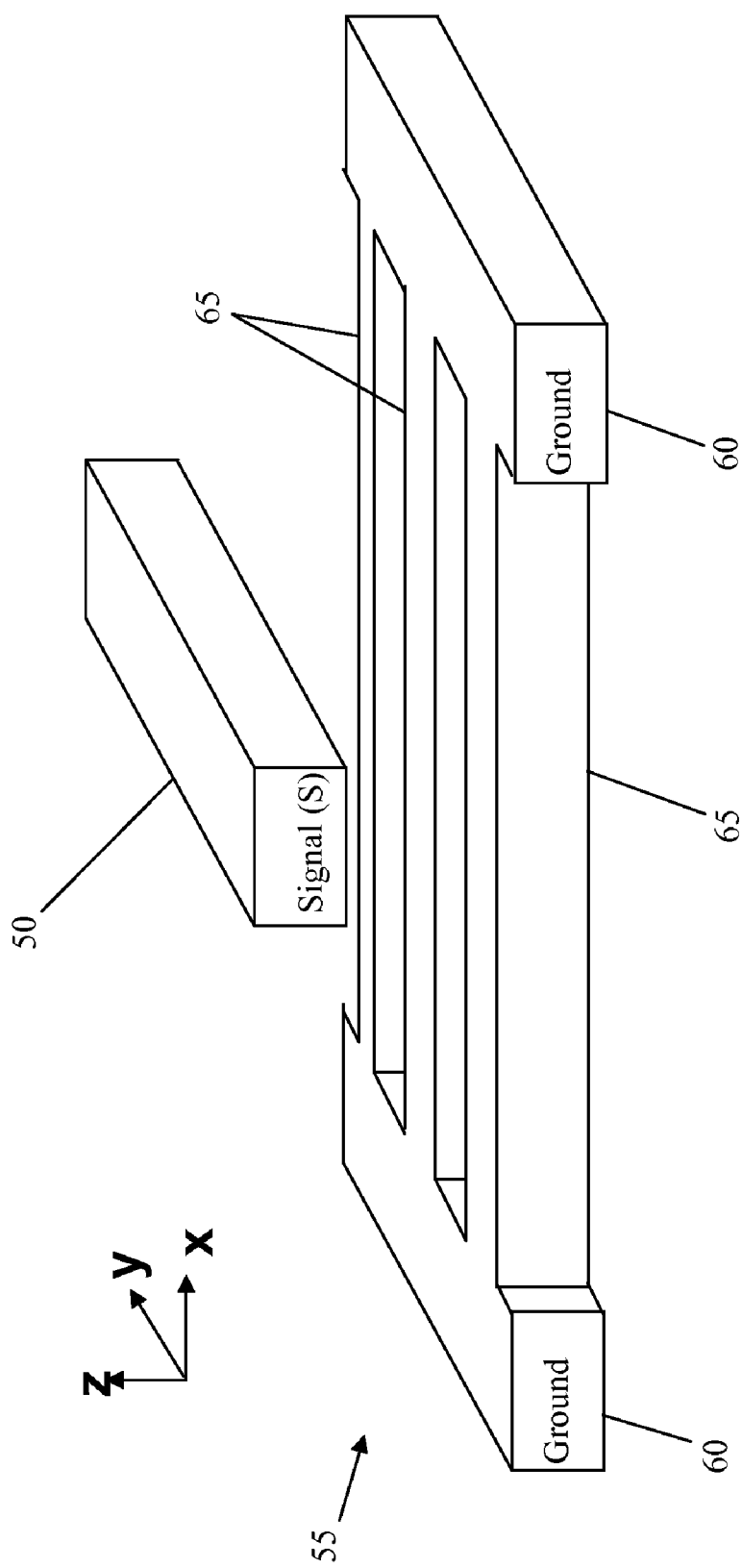

FIG. 3 shows another transmission line structure in accordance with aspects of the invention. The transmission line structure comprises a signal line 50, which may be, for example, a metal line formed in a wiring level of a semiconductor device, as described in greater detail below. The transmission line structure also includes a ground return structure 55, which may comprise, for example, a metal structure formed in a wiring level of a semiconductor device below the level of the signal line 50, as described in greater detail below.

In embodiments, the ground return structure 55 comprises ground return rails 60 that are substantially parallel to the signal line 50. Also, the ground return structure 55 comprises capacitance comb elements 65 that are formed between the ground return rails 60 and substantially orthogonal to the signal line 50. In such a transmission line structure, the capacitance of the transmission line structure is equal to the capacitance from the signal line to the plane of the capacitance comb elements 65, and the inductance of the transmission line structure is formed in the current return path of the signal line 50 and the ground return rails 60.

Figure 4:
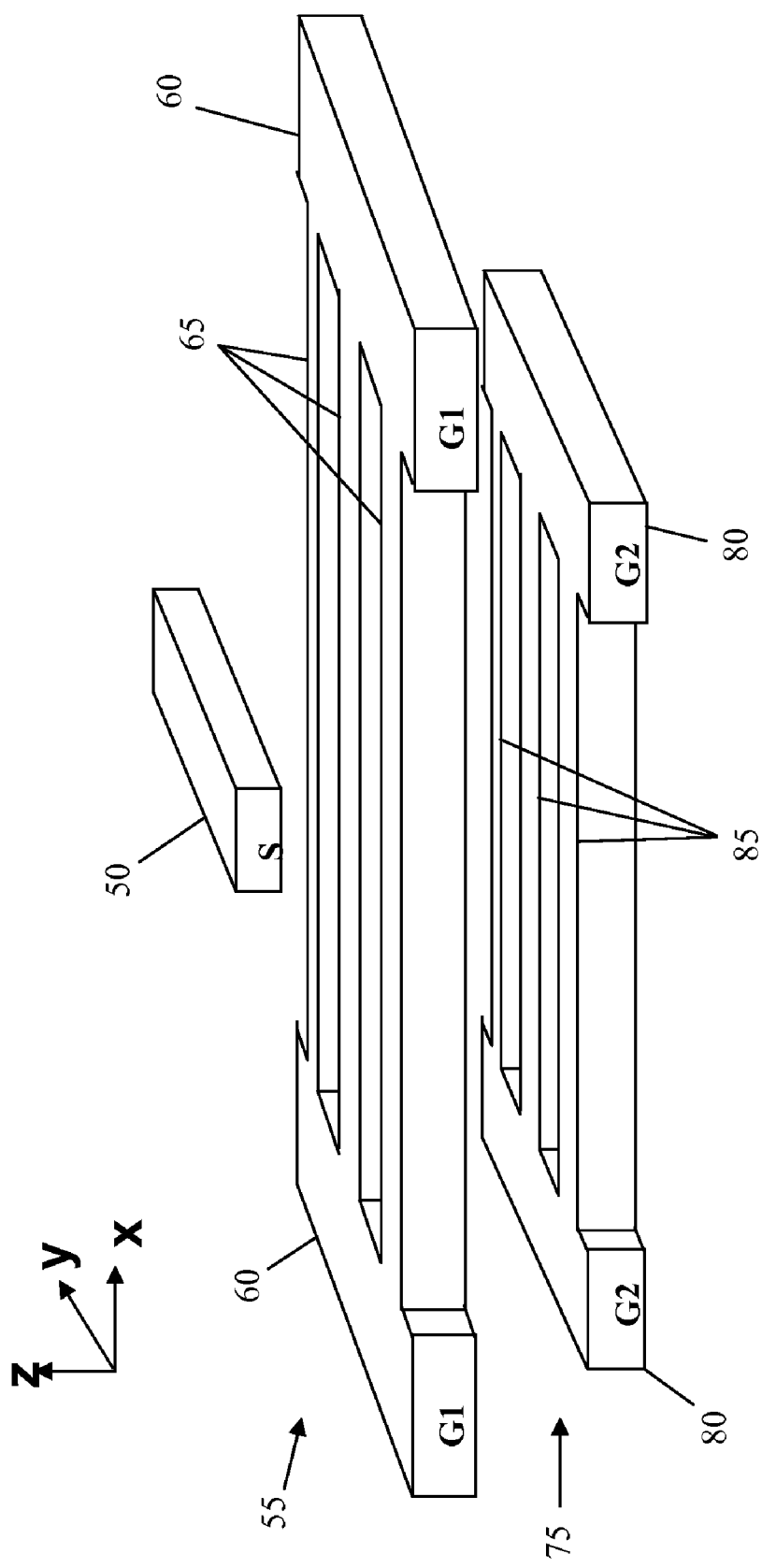

FIG. 4 shows another transmission line structure in accordance with aspects of the invention. Like the transmission line structure of FIG. 3, the transmission line structure of FIG. 4 includes a signal line 50 and a ground return structure 55 (referred to in this and other figures as "G1") having ground return rails 60 and comb elements 65. Additionally, the transmission line structure depicted in FIG. 4 includes a second ground return structure 75 (referred to in this and other figures as "G2") having ground return rails 80 and comb elements 85. The second ground return structure 75 may comprise, for example, a metal structure formed in a wiring level of a semiconductor device below the level of the first ground return structure 55, as described in greater detail below. At least one switch (not shown) may be provided for switching the first and second ground return structures 55, 75 between grounded and floating states, such that the ground return path of the transmission line structure follows either the first or second ground return structure.

In embodiments, the capacitance combs 65, 85 are formed perpendicular to the signal line 50 and of such a size and shape that they are substantially inductively invisible to the signal line 50. As such, the inductance of the transmission line structure is formed in the current return path of the signal line 50 and the ground return rails (e.g., 60 or 80) of whichever ground return structure is grounded, while the floating structure has very little or no effect on the inductance of the transmission line structure. So, for example, in a state where the first ground return structure 55 is floating and the second ground return structure 75 is grounded, the inductance of the transmission line structure is formed in the current return path of the signal line 50 and the ground return rails 80, with the first ground return structure 55 having little or no effect on the inductance of the transmission line structure.

Similarly, the capacitance of the transmission line structure shown in FIG. 4 is predominantly driven by whichever ground return structure (e.g., 55 or 75) is grounded. That is to say, in a state when the first ground return structure 55 is floating and the second ground return structure 75 is grounded, the capacitance of the transmission line structure is substantially equal to the capacitance from the signal line to the plane of the upper surfaces of the combs 85. Unlike with inductance, however, the floating ground return structure does affect the capacitance of the transmission line structure, although the capacitance effect of the floating structure is small compared to the capacitance effect of the grounded structure.

In embodiments, the first and second ground return structures 55, 75 are formed having geometries and distances from the signal line 50 such that, depending on which of the two ground return structures is grounded, the transmission line structure will have a different delay (e.g., SQRT(L*C)). However, the geometries and relative locations of the first and second ground return structures 55, 75 are also designed such that the characteristic impedance of the transmission line structure (e.g., SQRT(L/C)) is substantially constant, regardless of which of the two ground return structures is grounded. In this manner, by controlling which ground return structure (e.g., 55 or 75) is grounded and which is floating, the delay of the transmission line structure can be changed without substantially changing the characteristic impedance of the transmission line structure. Accordingly, implementations of the invention provide a single microstrip structure in which the delay can be varied while the characteristic impedance is kept relatively constant.

For example, still referring to the exemplary structure shown in FIG. 4, in embodiments of the invention, the ground return rails 60 are sized and spaced further away form the signal line 50 than are the ground return rails 80. This results in first ground return structure 55 (e.g., G1) providing a higher inductance than second ground return structure 75 (e.g., G2). Moreover, the combs 65 are sized and spaced closer to the signal line 50 than the combs 85, resulting in the first ground return structure 55 providing a higher capacitance than second ground return structure 75. By appropriately selecting the sizes and locations of the features (e.g., 50, 60, 65, 80, 85), the following relationships may be achieved:

$$t1 = SQRT(L1*C1) > t2 = SQRT(L2*C2)$$

$$Zo1 = SQRT(L1/C1) \cong Zo2 = SQRT(L2/C2)$$

where:
- t1≡transmission line structure delay when G1 is grounded and G2 is floating;
- t2≡transmission line structure delay when G2 is grounded and G1 is floating;
- Zo1≡transmission line structure characteristic impedance when G1 is grounded and G2 is floating;
- Zo2≡transmission line structure characteristic impedance when G1 is grounded and G2 is floating;
- L1≡transmission line structure inductance when G1 is grounded and G2 is floating;
- C1≡transmission line structure capacitance when G1 is grounded and G2 is floating;
- L2≡transmission line structure inductance when G2 is grounded and G1 is floating; and
- C2≡transmission line structure capacitance when G2 is grounded and G1 is floating.

Figure 5:
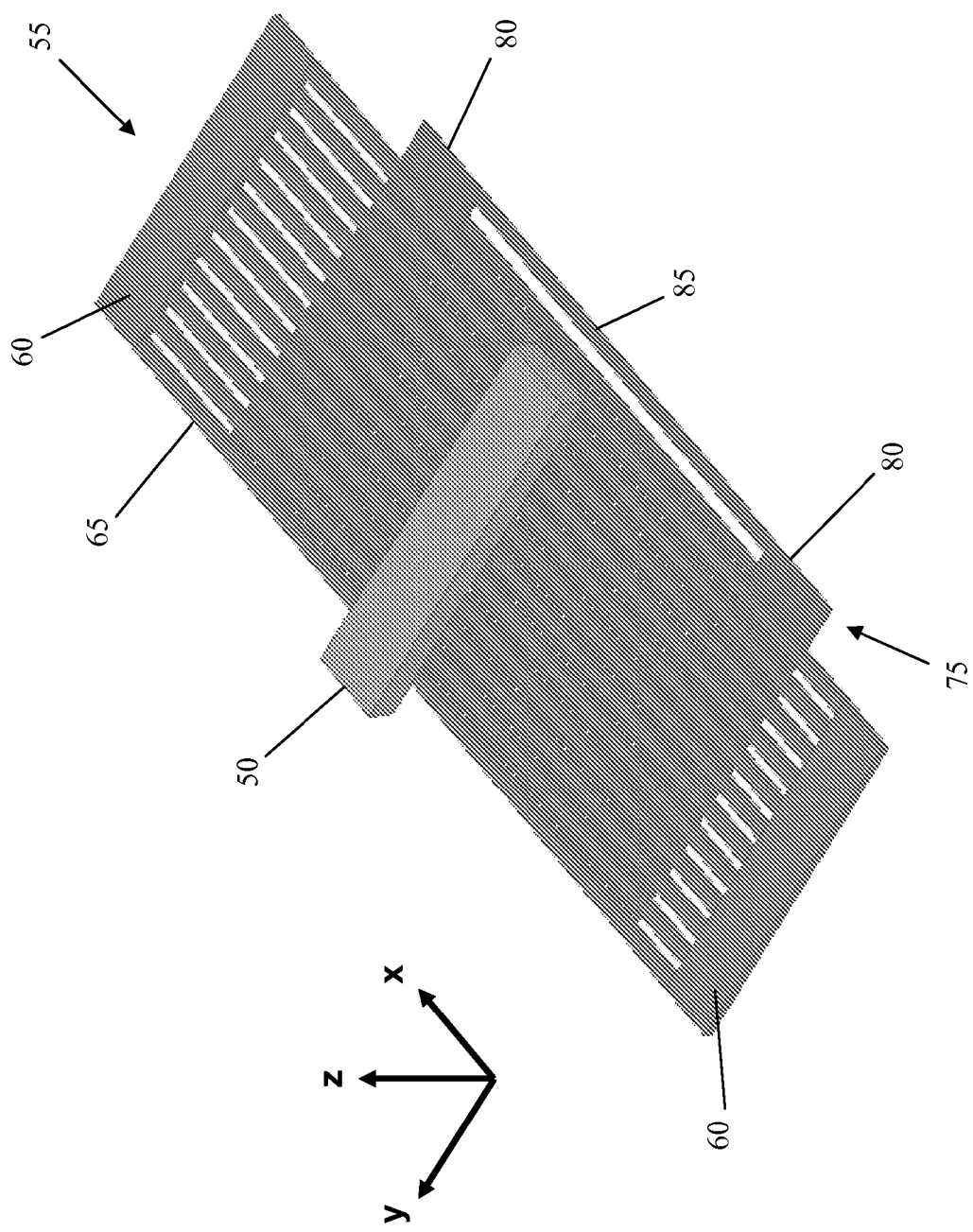

FIG. 5 shows another structure in accordance with aspects of the invention. The structure depicted in FIG. 5 is similar to the structure shown in FIG. 4, in that it includes a signal line 50, first ground return structure 55 having ground return rails 60 and combs 65, and second ground return structure 75 having ground return rails 80 and combs 85.

In the exemplary structure shown in FIG. 5, the signal line 50 is formed in an uppermost wiring level (e.g., level N) of an analog semiconductor structure, and has a width of about 10 µm in the "x" direction and a length of about 50 µm in the "y" direction. In embodiments, the first ground return structure 55 is formed in wiring level N–1, and has a same length in the "y" direction as the signal line 50. The combs 65 each have a length in the "x" direction of about 100 µm, and the ground return rails 60 each have a width in the "x" direction of about 8 µm. Also, the second ground return structure 75 is formed in wiring level N-4, and has a same length in the "y" direction as the signal line 50. The combs 85 each have a length in the "x" direction of about 50 µm, and the ground return rails 80 each have a width in the "x" direction of about 12 µm.

Table 3 shows values of transmission line structure capacitance, transmission line structure inductance, transmission line structure characteristic impedance, and transmission line structure delay for the exemplary structure shown in FIG. 5.

TABLE 3

| | State 1:<br>G1 grounded<br>G2 floating | State 2:<br>G1 floating<br>G2 grounded |
|---|---|---|
| Capacitance (fF) | 10.659 | 8.6977 |
| Inductance (pH) | 25.781 | 23.402 |
| Characteristic Impedance (Ohm) | 49.18 | 51.87 |
| Delay (pS) | 16.577 | 14.267 |

As seen in Table 3, a change in transmission line structure delay of about 16.1% is achieved between the two states, while the characteristic impedance of the transmission line structure changes only about 5.5% between the same two states. While specific dimensions, sizes, and geometries have been described, the invention is not limited to these specific examples. Instead, by utilizing different semiconductor structures, differences in delays of about 30% to 40% are attainable while still maintaining only about a 5% difference in characteristic impedance. More specifically, any desired size and shaped structures (e.g., 50, 55, 75) may be used in implementations of the invention. For example, different sized and shaped structures (e.g., 50, 55, 75) may be used within the scope of the invention to provide a transmission line structure having different delays but having the same or substantially the same characteristic impedance for different ground return paths (e.g., G1, G2).

Figure 6:
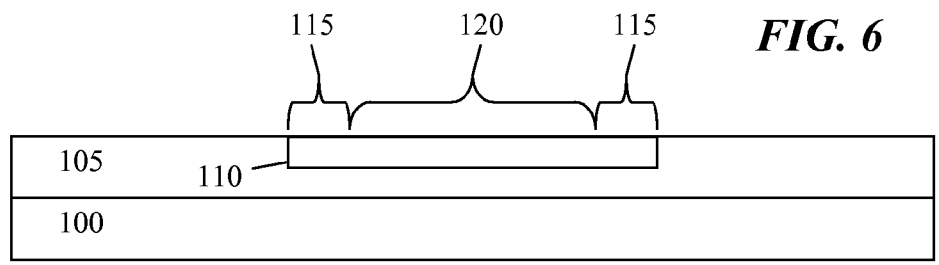
FIGS. 6-8 show intermediate structures and process steps in accordance with aspects of the invention.
Figure 7:
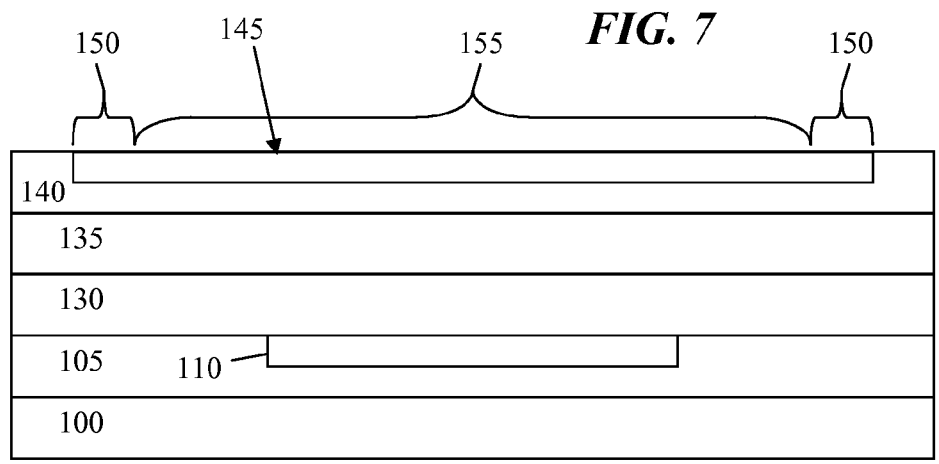
Figure 8:
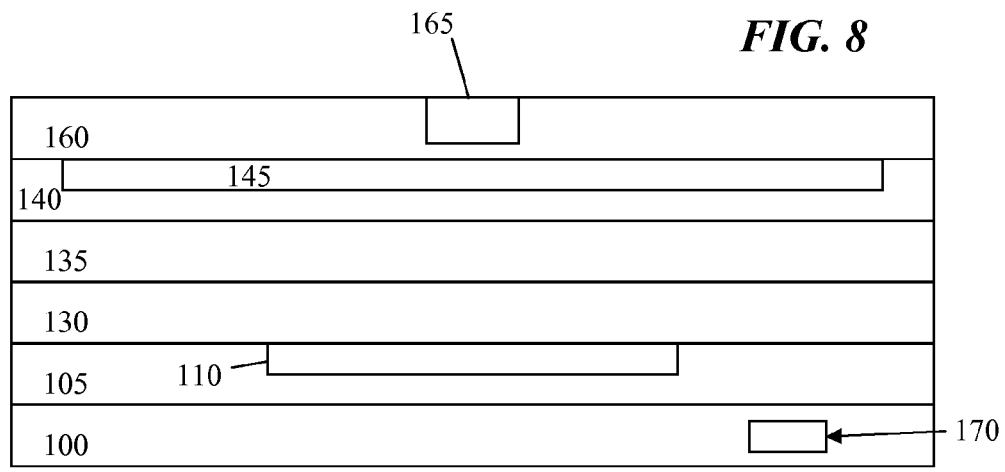

FIGS. 6-8 show intermediate structures and respective processing steps for forming transmission line structures in accordance with aspects of the invention. Specifically, FIG. 6 shows a cross section of an exemplary semiconductor structure comprising a substrate 100 and wiring level 105 formed thereon. The substrate 100 may be formed using conventional processing techniques, and may include, for example, a silicon substrate having semiconductor devices (e.g., gates, source/drain regions, etc.) formed therein. The wiring level 105 may be formed using conventional processes, and may be composed of any suitable material, including, but not limited, high k dielectric, low k dielectric, ultra low k dielectric, etc.

Still referring to FIG. 6, a ground return structure 110 is formed in the wiring level 105. The ground return structure 75 may be composed of any suitable conducting material, including, but not limited to: copper, aluminum, alloys, etc., and may be formed using conventional processes. The ground return structure 110 may be similar in shape to ground return structure 75 described above with respect to FIGS. 4 and 5, or may have a different shape. For example, the ground return structure 110 may include ground return rail portions 115 (e.g., similar to ground return rails 80) and comb portions 120 (e.g., similar to combs 85).

FIG. 7 shows the structure of FIG. 6, onto which additional wiring levels 130, 135, and 140 have been formed. Formed in wiring level 140 is ground return structure 145, which may be formed using similar materials and processes as ground return structure 110. The ground return structure 145 may be similar in shape to ground return structure 55 described above with respect to FIGS. 4 and 5, or may have a different shape. For example, the ground return structure 145 may include ground return rail portions 150 (e.g., similar to ground return rails 60) and comb portions 155 (e.g., similar to combs 65).

FIG. 8 shows the structure of FIG. 7, onto which additional wiring level 160 is formed, using, for example, conventional materials and techniques. Moreover, signal line 165 is formed in the wiring level 160. The signal line 165 may be similar to signal line 50 described above with respect to FIGS. 4 and 5, or may have a different shape. The signal line 165 may be made of any suitable conducting material, including, but not limited to: copper, aluminum, alloys, etc., and may be formed using conventional processes.

The features of FIGS. 6-8 (e.g., 100, 105, 110, 130, 135, 140, 145, 160, 165) may be formed using conventional techniques, such as, standard back end of line (BEOL) processes. For example, these features may be formed using manufacturing processes including, but not limited to: photolithographic masking and exposure, etching (e.g., reactive ion etching (RIE), etc.), metallization (e.g., chemical vapor deposition (CVD), etc.), and planarizing and polishing (e.g., chemical mechanical polishing (CMP), etc.). Moreover, additional features not shown in FIGS. 6-8 may be used with implementations of the invention. For example, barrier material may be employed as liners, caps, etc. Moreover, via levels may be interposed between any of the wiring levels.

Furthermore, the wiring levels may have any suitable thickness, and may be of differing thickness relative to each other. For example, wiring levels 105, 130, 135 may have a thickness of about 0.5 µm to 0.6 µm, while wiring level 140 may be about 3 µm thick, and wiring level 160 may be about 4 µm thick. However, the invention is not limited to these values, and any suitable thicknesses may be employed. Moreover, the invention is not limited to the number of wiring levels shown. Rather, aspects of the invention can be used with a semiconductor device having any number of wiring levels (e.g., analog devices, digital devices, etc.)

Even further, the ground return structures 110, 145, and the signal line 165 may be of any suitable size and shape. Moreover, the ground return structures 110, 145 (e.g., G1, G2) are not confined to a single respective wiring level, but may span plural wiring levels (and via levels, if present), as described in further detail below with respect to FIGS. 9-12. Moreover, the invention is not limited to two ground return structures 110, 145 as shown in FIG. 8. Instead, any number of ground return structures 110, 145 may be used to provide any desired number of different delays for the transmission line structure.

In embodiments, at least one switch 170 may be provided in the device region of the substrate 100. The switch 170 may be operable to selectively connect either ground return structure (e.g., 110 or 145) to ground, thereby causing the grounded ground return structure (e.g., 110 or 145) to be the ground return path for the signal line 165. The switch 170 may comprise any suitable switching device, such as, for example, a PIN diode, FET, etc. In embodiments, the switch 170 is arranged in the ground return path of the transmission line structure, not in the signal path, so as to avoid signal attenuation in the signal path.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

Figure 10:
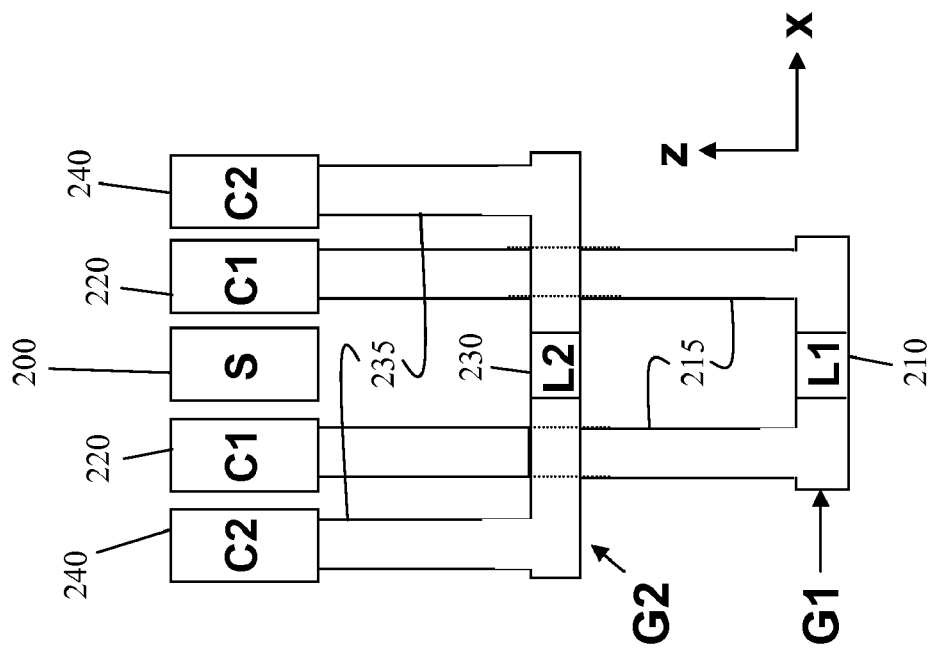
FIGS. 9-14 show structures in accordance with aspects of the invention.
Figure 9:
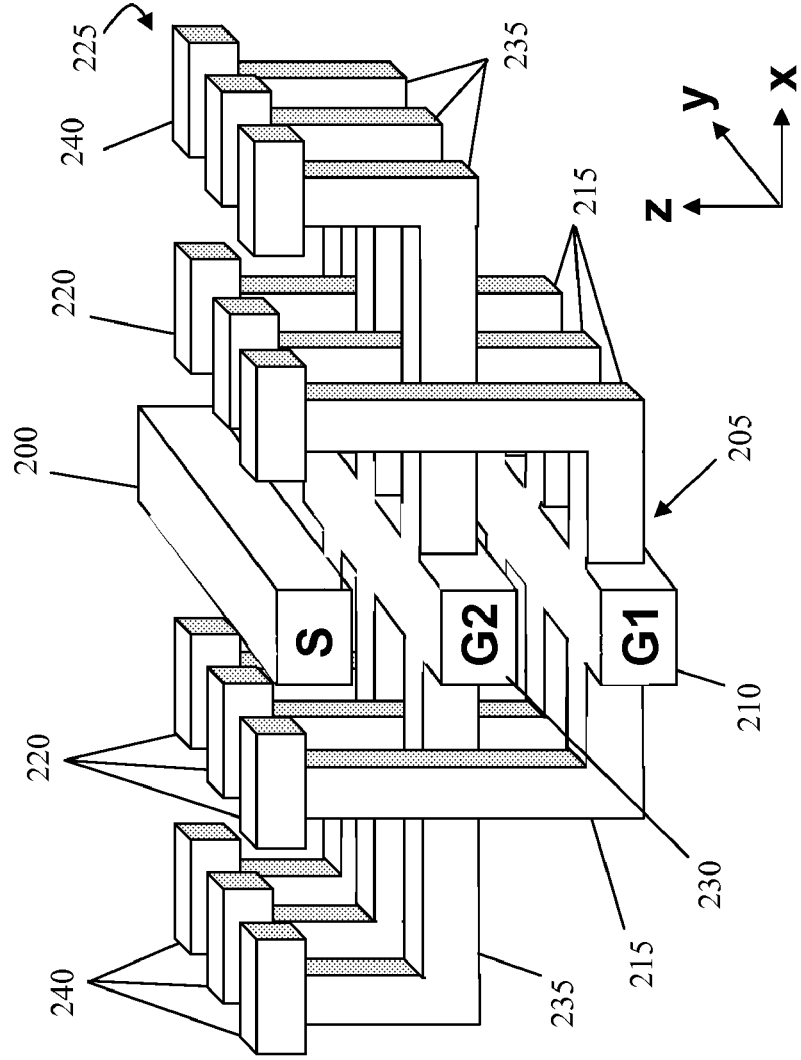

FIGS. 9 and 10 show an alternative transmission line structure in accordance with aspects of the invention. Specifically, FIG. 9 shows the transmission line structure includes a signal line 200, first ground return structure 205 (e.g., G1), and second ground return structure 225 (e.g., G2), all of which may be formed in a manner described above. The first ground return structure 205 includes a single ground return rail 210, which may be similar in material and manufacture to ground return rails, e.g., 60, 80, etc. The first ground return structure 205 also includes capacitance combs 215 extending from the ground return rail 210, and extending up through plural wiring levels (not shown), and ending at capacitance elements 220 formed in the same wiring level as the signal line 200.

Still referring to FIG. 9, the second ground return structure 225 includes a single ground return rail 230, which may be similar to ground return rail 210. The second ground return structure 225 also includes capacitance combs 235 extending from the ground return rail 230, and extending up through plural wiring levels (not shown), and ending at capacitance elements 240 formed in the same wiring level as the signal line 200. At least one switch (not shown) may be provided for selectively placing one of respective ground return structures 205 and 225 in a ground state, while the other floats.

FIG. 10 shows a cross sectional view of the structure of FIG. 9. The capacitance contribution of the first ground return structure 205 is dominated by the elements 220, labeled with "C1" in FIG. 10. The capacitance contribution of the second ground return structure 225 is dominated by the elements 240, labeled with "C2" in FIG. 10. The primary inductance contributor of the first ground return structure 205 is ground return rail 210, labeled with "L1" in FIG. 10. The primary inductance contributor of the second ground return structure 225 is ground return rail 230, labeled with "L2" in FIG. 10.

Figure 12:
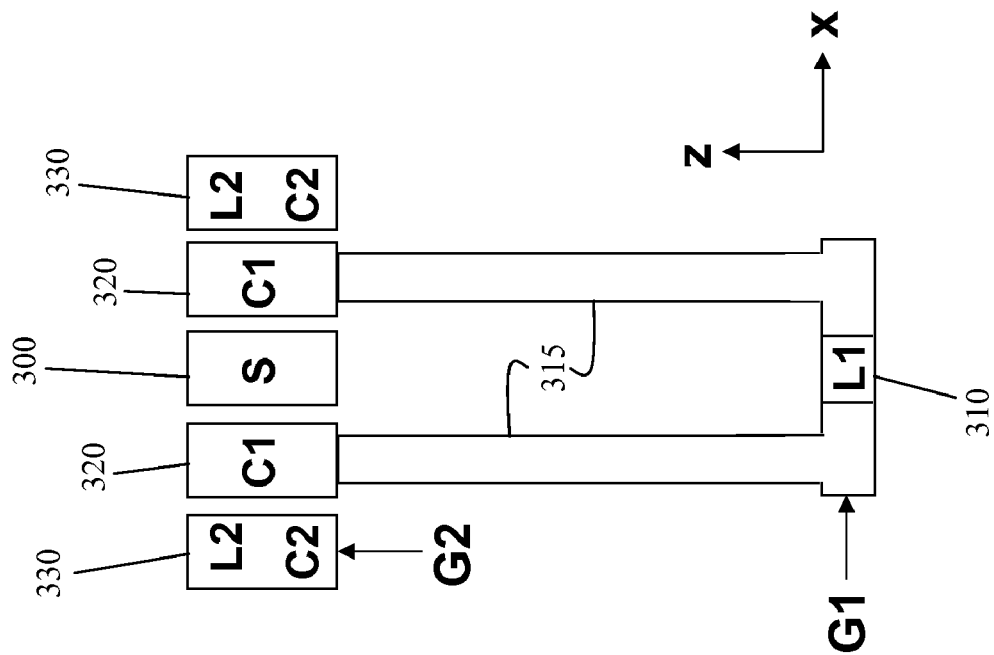
Figure 11:
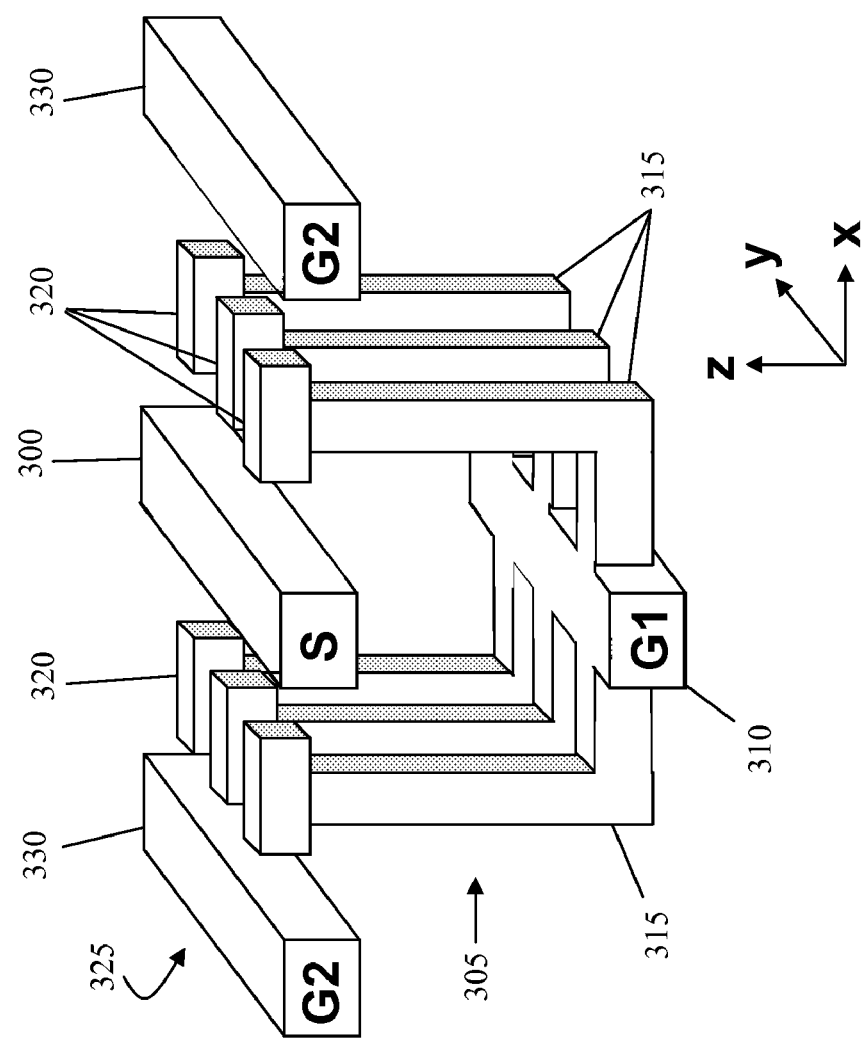

FIGS. 11 and 12 show an alternative transmission line structure in accordance with aspects of the invention. Specifically, FIG. 11 shows that the transmission line structure includes a signal line 300, first ground return structure 305 (e.g., G1), and second ground return structure 325 (e.g., G2), all of which may be formed in a manner described above. The first ground return structure 305 includes a single ground return rail 310, which may be similar to ground return rail 205 (e.g., in FIG. 9). The first ground return structure 305 also includes combs 315 extending from the ground return rail 310, extending up through plural wiring levels (not shown), and ending at capacitance elements 320 formed in the same wiring level as the signal line 300.

Still referring to FIG. 11, the second ground return structure 325 includes two ground return rails 330, which may be similar to ground return rail 310. The ground return rails 330 are formed in the same wiring level as the signal line 300, constituting a co-planar transmission line. The second ground return structure 325 does not include capacitance combs. At least one switch (not shown) may be provided for selectively placing one of respective ground return structures 305 and 325 in a ground state, while the other floats.

FIG. 12 shows a cross sectional view of the structure of FIG. 11. The capacitance contribution of the first ground return structure 305 is dominated by the elements 320, labeled with "C1" in FIG. 12. The capacitance contribution of the second ground return structure 325 is dominated by the ground return rails 330, labeled with "C2" in FIG. 12. The primary inductance contributor of the first ground return structure 305 is ground return rail 310, labeled with "L1" in FIG. 10. The primary inductance contributor of the second ground return structure 325 is ground return rails 330, labeled with "L2" in FIG. 10.

Figure 13:
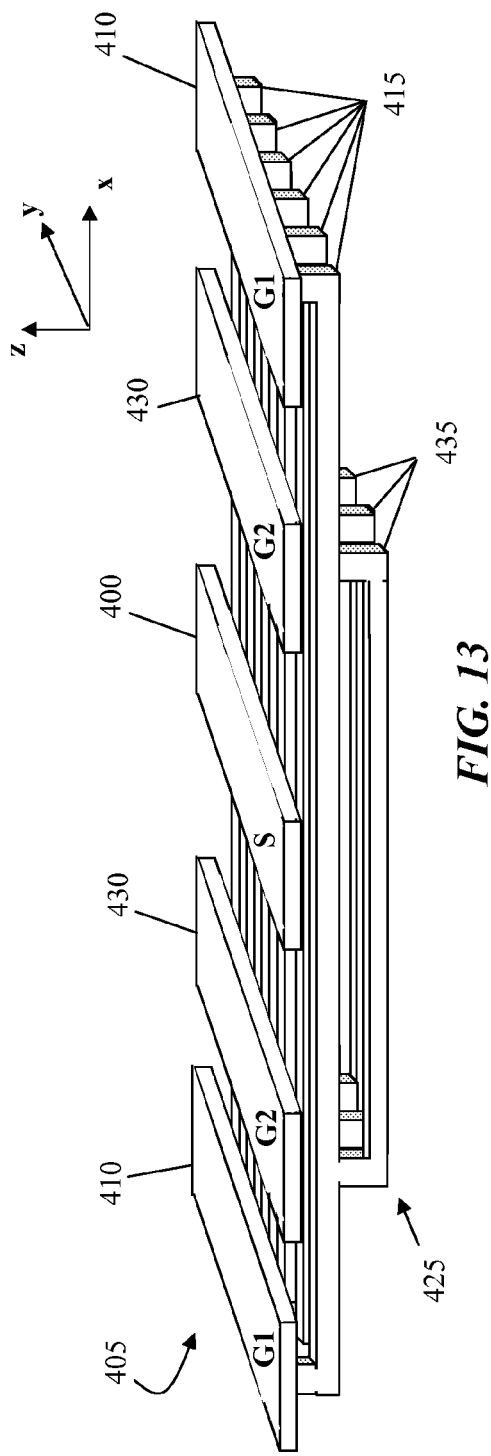
Figure 14:
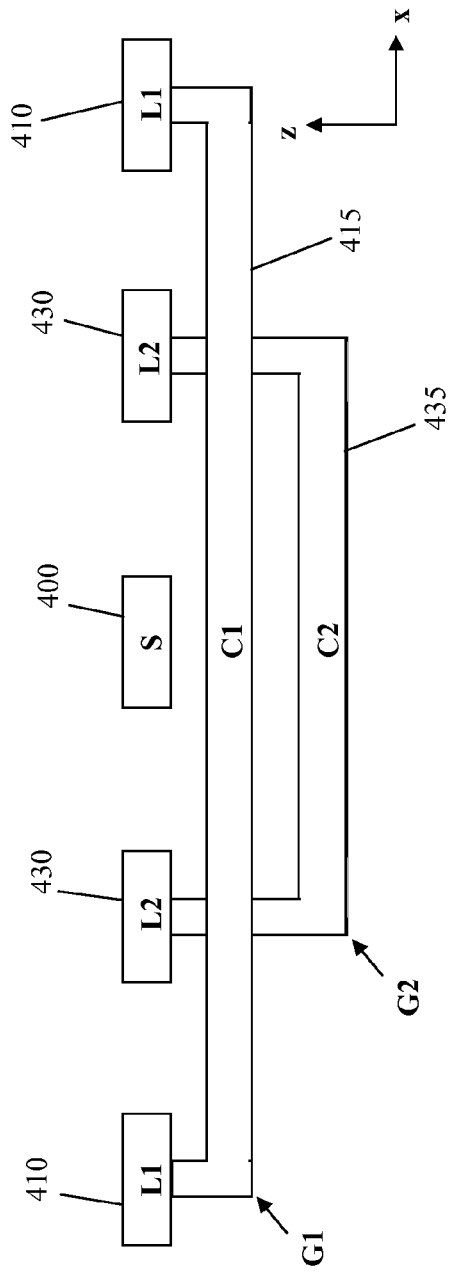

FIGS. 13 and 14 show an alternative transmission line structure in accordance with aspects of the invention. Specifically, FIG. 13 shows the transmission line structure includes a signal line 400, first ground return structure 405 (e.g., G1), and second ground return structure 425 (e.g., G2), all of which may be formed in a manner described above. The first ground return structure 405 includes two parallel ground return rails 410, which are formed in the same wiring level as the signal line 400. The first ground return structure 405 also includes combs 415 extending between the ground return rails 410 in wiring levels below the signal line 400.

Still referring to FIG. 13, the second ground return structure 425 includes two parallel ground return rails 430, which are formed in the same wiring level as the signal line 400. The second ground return structure 425 also includes combs 435 extending between the ground return rails 430 in wiring levels below the signal line 400. At least one switch (not shown)

may be provided for selectively placing one of respective ground return structures 405 and 425 in a ground state, while the other floats.

FIG. 14 shows a cross sectional view of the structure of FIG. 13. The capacitance contribution of the first ground return structure 405 is dominated by the combs 415, labeled with "C1" in FIG. 14. The capacitance contribution of the second ground return structure 425 is dominated by the combs 435, labeled with "C2" in FIG. 14. The primary inductance contributor of the first ground return structure 405 is ground return rails 410, labeled with "L1" in FIG. 14. The primary inductance contributor of the second ground return structure 425 is ground return rails 430, labeled with "L2" in FIG. 14.

In embodiments, the features of the respective ground return structures shown in FIGS. 9-14 (e.g., G1 and G2) may be formed in any suitable size and shape, and in any appropriate spatial relationship with respect to the signal line (e.g., 200, 300, 400). Particularly, the features of the respective ground return structures (e.g., G1 and G2) may be formed such that the transmission line structure delay differs depending on which ground return structure (e.g., G1 or G2) is grounded, while the transmission line structure characteristic impedance remains substantially constant regardless of which ground return structure is grounded. In embodiments, the characteristic impedance is set at about 50 ohm, although the invention is not limited to this value, and any characteristic impedance may be used with the invention.

The transmission line structures described thusfar have each included two switchable ground return structures. However, the invention is not limited to a transmission line structure having only two switchable ground return structures. Instead, more than two (e.g., three, four, etc.) switchable ground return structures can be used to provide greater tunability to a transmission line structure.

Figure 15:
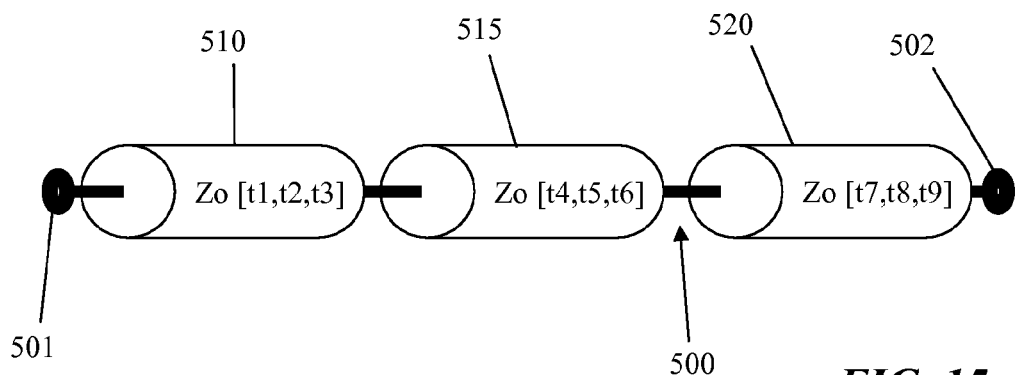
FIG. 15 shows a block diagram in accordance with aspects of the invention.

In further embodiments, additional tunability may be provided to a transmission line by forming plural adjustable-delay, fixed-impedance sections in series along the transmission line. For example, FIG. 15 shows a block diagram in accordance with aspects of the invention, in which a transmission line 500 extends between two points 501, 502. The transmission line 500 is provided with three respective sections adjustable-delay, fixed-impedance 510, 515, 520, which may be formed using structures similar to those described above with respect to FIGS. 1-14.

More specifically, the first section 510 may comprise a transmission line structure having three selectively controllable delay values t1, t2, t3, and a relatively constant characteristic impedance Zo. Similarly, the second section 515 may comprise a transmission line structure having three selectively controllable delay values t4, t5, t6, and a relatively constant characteristic impedance Zo. Similarly, the third section 520 may comprise a transmission line structure having three selectively controllable delay values t7, t8, t9, and a relatively constant characteristic impedance Zo.

According to an aspect of the invention, the sections 510, 515, and 520 are identical, such that t1=t4=t7, and t2=t5=t8, and t3=t6=t9. In such an embodiment, there are ten different delay permutations for the transmission line 500, each permuation having substantially the same characteristic impedance Zo. According to another aspect of the invention, the sections 510, 515, and 520 are all different, such that t1≠t2≠t3≠t4≠t5≠t6≠t7≠t8≠t9. In such an embodiment, there are twenty seven different delay permutations for the transmission line 500, each permutation having substantially the same characteristic impedance Zo.

Figure 16:
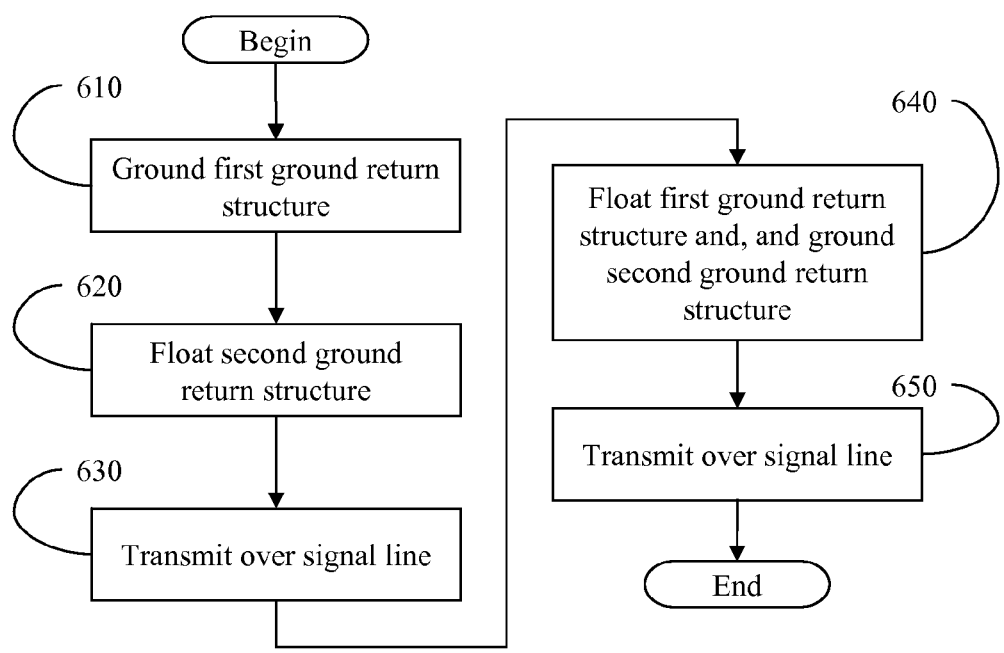
FIG. 16 is a flow diagram depicting processes according to aspects of the invention.

FIG. 16 is a flow diagram implementing steps in accordance with aspects of the invention. The flow diagram may equally represent a high-level block diagram of the invention. The steps of the flow diagram may be controlled and executed from a server, in a client-server relationship, by computing devices in an ad hoc network, or they may run on a user workstation with operative information conveyed to the user workstation. Additionally, the invention can be controlled using an entirely hardware embodiment, an entirely software embodiment or an embodiment containing both hardware and software elements. In an embodiment, the software elements include firmware, resident software, microcode, etc.

Furthermore, the invention can be controlled by a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

More specifically, FIG. 16 shows a flow diagram depicting control steps of a method for adjusting the delay in a transmission line structure. At step 610, a first ground return structure of a transmission line structure is electrically connected to a ground potential. In embodiments, the transmission line structure and ground return structure may be similar to those described above with respect to FIGS. 4-15 (e.g., G1). In embodiments, the connection is created by operating a switch integrated in the semiconductor device region of the transmission line structure. Operation of the switch may be performed in any suitable manner, such as, for example, computer control. As a result of step 610, the first ground return structure is provided as a ground return path for the signal line of the transmission line structure.

At step 620, a second ground return structure integrated in the same transmission line structure is electrically disconnected from the ground potential. The second ground return structure may be similar to those described above with respect to FIGS. 4-15 (e.g., G2), such that such that the delay of the differs depending on which ground return structure is grounded, while the characteristic impedance of the transmission line structure remains substantially constant regardless of which ground return structure is grounded. In embodiments, the disconnecting at step 620 may be performed simultaneously, or at a different time, as the connecting at step 610. Moreover, the disconnecting at step 620 may be performed using the same switch, or using a different switch, as the connecting at step 610.

At step 630, a signal is transmitted on the signal line of the transmission line structure. In embodiments, transmitting the signal my be performed in any suitable manner. Due to the connecting at step 610, the transmission will have a delay primarily determined by the first ground return structure.

At step 640, the first ground return structure is disconnected from the ground potential, and the second ground return structure is connected to the ground potential. This may be performed in a manner similar to steps 610 and 620, substituting the first ground return structure for the second ground return structure, and vice versa. As a result of step 640, the second ground return structure is provided as a ground return path for the signal line of the transmission line structure, while the first ground return structure is floated.

At step 650, a signal is transmitted on the signal line of the transmission line structure. This may be performed in a manner similar to step 630. Due to step 640, the transmission will have a delay primarily determined by the second ground return structure. In embodiments, the delay at step 650 is different from the delay at step 630, however the characteristic impedance of the transmission line structure is the same in both transmission steps 630 and 650.

Figure 17:
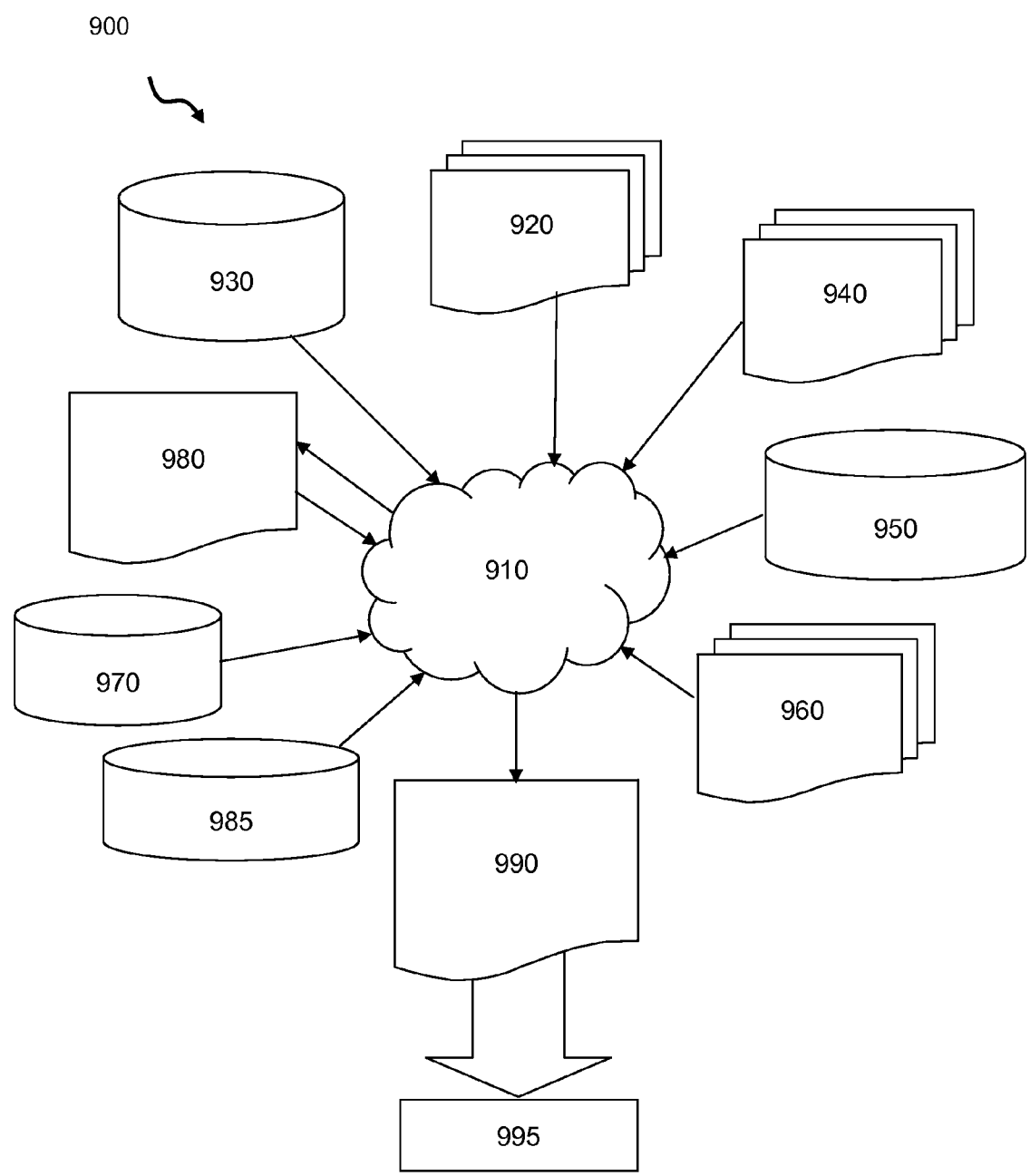
FIG. 17 is a flow diagram of a design process used in semiconductor design, manufacture, and/or test.

FIG. 17 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1-5 and 8-15. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 17 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-5 and 8-15. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-5 and 8-15 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5 and 8-15. In one embodiment, design structure 990 may comprise a compiled, executable HDL simulation model that functionally simulates the devices shown in FIGS. 1-15.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5 and 8-15. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of manufacturing a transmission line structure, comprising:
   forming a signal line of the transmission line structure;
   forming a first ground return structure that causes a first delay and a first characteristic impedance in the transmission line structure; and
   forming a second ground return structure that causes a second delay and a second characteristic impedance in the transmission line structure;
   wherein the first delay is different from the second delay, and the first characteristic impedance is substantially the same as the second characteristic impedance, and
   the first ground return structure provides a higher inductance than the second ground return structure.

2. The method of claim 1, wherein the signal line, first ground return structure and second ground return structure are formed in a semiconductor structure.

3. The method of claim 2, wherein:
   the signal line is formed in a first wiring level of the semiconductor structure,
   the first ground return structure is formed in a second wiring level of the semiconductor structure, and
   the second ground return structure is formed in a third level of the semiconductor structure.

4. The method of claim 3, wherein:
   the first wiring level is different from the second wiring level, and
   a portion of the first ground return structure is also formed in the first wiring level.

5. The method of claim 4, wherein:
   the signal line is formed in a first wiring level of the semiconductor structure,
   the first ground return structure is formed in the first wiring level, and
   portions of the second ground return structure are formed in the first wiring level and a second wiring level of the semiconductor structure.

6. The method of claim 2, wherein a switch operates to ground one of the first and second ground return structures and to float the other of the second and first ground return structures, respectively.

7. The method of claim 2, wherein:
   the first ground return structure comprises a first ground return rail and a first capacitance structure, and
   the second ground return structure comprises a second ground return rail and a second capacitance structure.

8. The method of claim 7, wherein:
   the first ground return rail is further away from the signal line than the second ground return rail, and
   the first capacitance structure is closer to the signal line than the second capacitance structure.

9. The method of claim 1, wherein the first and second delays are delays of a signal in the signal line.

10. The method of claim 1, wherein:
    the first ground return structure comprises first ground return rails and first capacitance comb elements connected to and extending between the first ground return rails; and
    the second ground return structure comprises second ground return rails and second capacitance comb elements connected to and extending between the second ground return rails.

11. The method of claim 10, further comprising:
    forming the signal line in a first wiring level of a semiconductor structure;
    forming the first ground return rails and the first capacitance comb elements in a second wiring level of the semiconductor structure; and
    forming the second ground return rails and the second capacitance comb elements in a third wiring level of the semiconductor structure.

12. The method of claim 10, wherein the first ground return rails are sized and spaced further away from the signal line than are the second ground return rails resulting in the first ground return structure providing said higher inductance than the second ground return structure.

13. The method of claim 12, wherein the first capacitance comb elements are sized and spaced closer to the signal line than the second capacitance comb elements resulting in the first ground return structure providing a higher capacitance than the second ground return structure.

14. A method of manufacturing a transmission line structure, comprising:
    forming a signal line of the transmission line structure;
    forming a first ground return structure that causes a first delay and a first characteristic impedance in the transmission line structure; and forming a second ground return structure that causes a second delay and a second characteristic impedance in the transmission line structure;

wherein the first delay is different from the second delay, and the first characteristic impedance is substantially the same as the second characteristic impedance, and the first delay is about 16% different from the second delay.

15. The method of claim 14, wherein the first characteristic impedance is less than about 5% different from the second characteristic impedance.

16. The method of claim 15, wherein the first characteristic impedance is about 50 ohm.

17. A method of transmitting a signal in a transmission line structure, comprising:

grounding a first ground return structure that causes a first delay and a first characteristic impedance of the transmission line structure;

floating a second ground return structure that causes a second delay different from the first delay and a second characteristic impedance substantially the same as the first characteristic impedance, wherein the first ground return structure provides a higher inductance than the second ground return structure; and transmitting a signal on a signal line of the transmission line structure.

18. The method of claim 17, wherein the signal line, the first ground return structure and the second ground return structure are formed in a semiconductor structure.

19. The method of claim 18, wherein the grounding and the floating comprise operating at least one switch in the semiconductor structure.

20. The method of claim 17, further comprising:
floating the first ground return structure;
grounding the second ground return structure; and
transmitting another signal on the signal line.

21. The method of claim 17, wherein:
the first delay is at least about 16% different from the second delay, and
the first characteristic impedance is less than about 5% different from the second characteristic impedance.

22. A method, comprising:
switching a transmission line structure between: (i) a first ground return structure that creates a first delay and a first characteristic impedance in the transmission line structure and (ii) a second ground return structure that creates a second delay and a second characteristic impedance of the transmission line structure, wherein the first delay is substantially different from the second delay, the first characteristic impedance is substantially equal to the second characteristic impedance, and the first ground return structure provides a higher inductance than the second ground return structure.

23. The method of claim 22, wherein the first ground return structure and the second ground return structure are formed in wiring levels of a single semiconductor structure.

24. The method of claim 22, wherein the switching is performed by at least one of a computer program product and a computing device.

* * * * *